United States Patent
Mori et al.

(10) Patent No.: US 6,180,253 B1
(45) Date of Patent: Jan. 30, 2001

(54) BRAZING OR SOLDERING MATERIAL AND PRODUCTION METHOD THEREOF

(75) Inventors: Yoshiaki Mori; Katsuhiro Takahashi; Takuya Miyakawa, all of Suwa (JP)

(73) Assignee: Seiko Epson Corporation, Tokyo (JP)

( * ) Notice: Under 35 U.S.C. 154(b), the term of this patent shall be extended for 0 days.

(21) Appl. No.: 09/054,237

(22) Filed: Apr. 2, 1998

(30) Foreign Application Priority Data

Apr. 15, 1997 (JP) .................................................. 9-097772

(51) Int. Cl.[7] ........................... B32B 15/04; C23C 14/22; C23C 16/08; B23K 31/02
(52) U.S. Cl. ................... 428/469; 148/283; 204/192.15; 228/206; 228/220; 427/255.39; 427/372.2; 428/614; 428/628; 428/696
(58) Field of Search ..................................... 428/614, 628, 428/469, 696; 148/283; 420/591, 501, 557, 563, 576; 427/372.2, 255.39, 255.4, 576, 419.1; 204/192.1, 192.15, 192.17; 205/316; 228/206, 220

(56) References Cited

U.S. PATENT DOCUMENTS 4,139,660 * 2/1979 Tur ........................................ 428/696
4,921,157 * 5/1990 Dishon et al. ......................... 228/220
5,615,825 * 4/1997 Bobbio et al. ........................ 228/206

FOREIGN PATENT DOCUMENTS

| 5-304235 | 11/1993 | (JP) . |
| 7-164136 | 6/1995 | (JP) . |
| 2527278 | 6/1996 | (JP) . |

* cited by examiner

*Primary Examiner*—Deborah Jones
*Assistant Examiner*—Robert R. Koehler

(57) ABSTRACT

The present invention provides a joining, brazing or soldering material wherein solderability is effectively improved without using a flux, and a production method thereof. In production of a joining material, a halogen compound is mixed, a film is formed on the surface of a solder molding or the surface of a solder molding is halogenated. In production of a joining material, a halogen compound is added to a solder melt, a film of a halogen compound is formed on the surface of a processed joining material, or the surface layer of the processed joining material is converted to a halogen compound layer by halogenation. Film formation or surface treatment may be carried out either a dry or wet method.

20 Claims, 2 Drawing Sheets

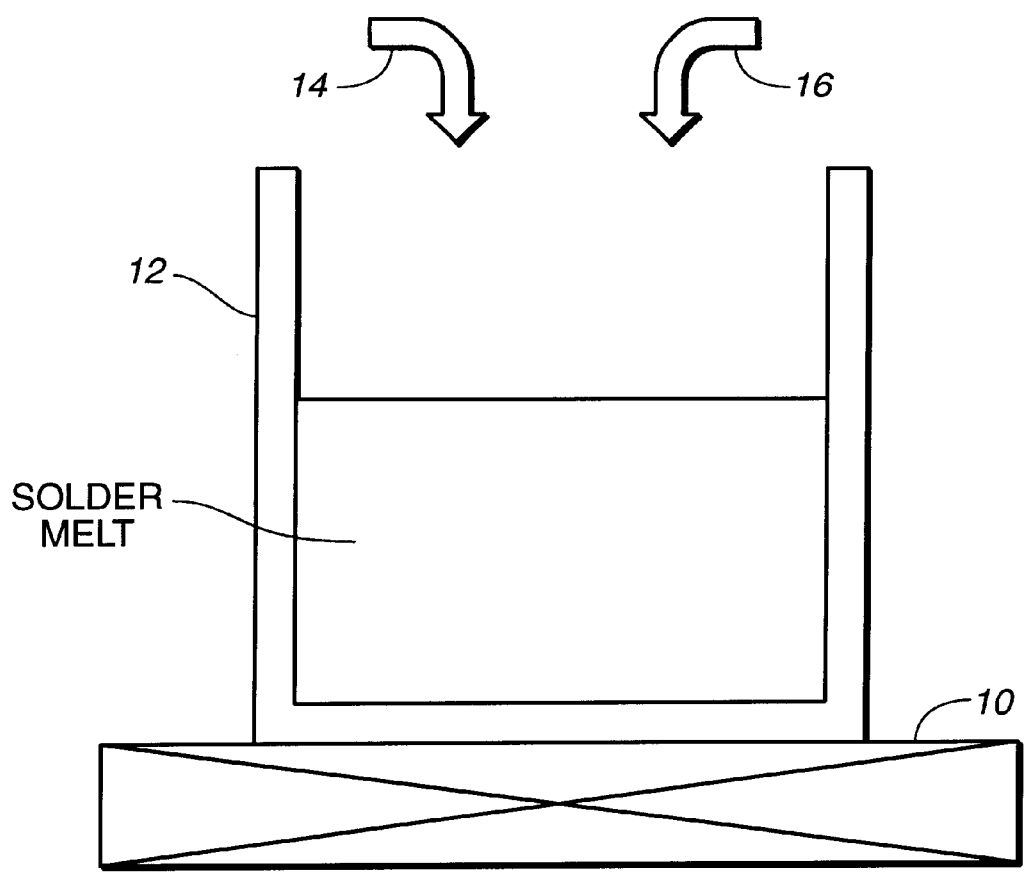
FIG._1

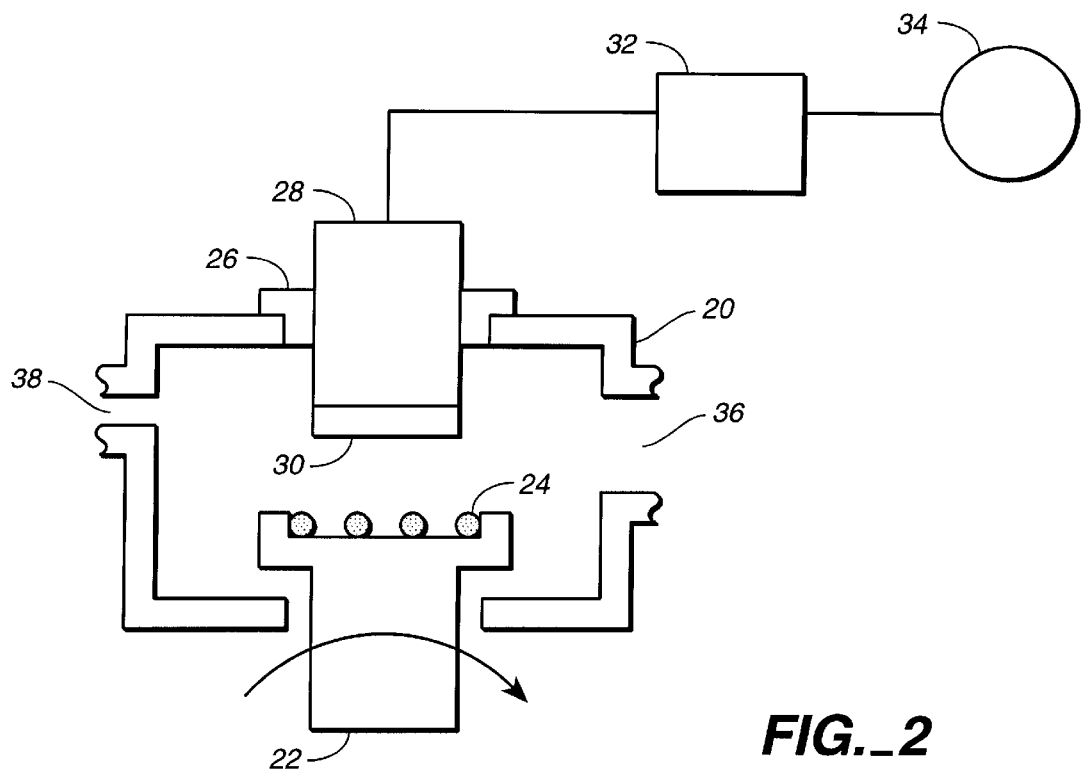
FIG._2
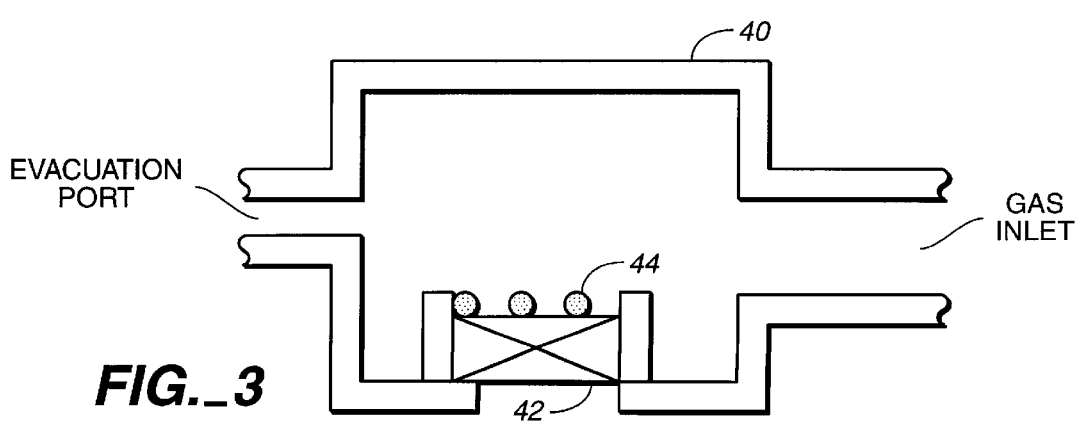
FIG._3

BRAZING OR SOLDERING MATERIAL AND PRODUCTION METHOD THEREOF

BACKGROUND OF THE INVENTION

1. Field of the Invention

The present invention relates to a brazing or soldering material and a production method thereof More particularly the present invention relates to a brazing or soldering material suitable for use in bonding a lead frame or the like, and a production method thereof

2. Description of the Related Art

A brazing material is used for bonding base materials by heat-melting a metal or an alloy having a melting point lower than that of the base materials to fill the gap between the base materials with the brazing material. Particularly, the brazing material permits bonding of complicated fine parts and bonding of different metals, has little influence on base materials, and is thus widely used for electronic apparatus. Of such brazing or soldering materials, solder frequently contains tin and lead as main components, and is frequently used for bonding a lead frame of an electronic apparatus which is required to have electrical conductivity. For solder, generally, consideration is mainly given to electrical conductivity rather than strength, and particularly solder is required to have high solderability for base materials.

In soldering, solderability is significantly affected by an oxide film on the surface of a base material. Japanese Patent Unexamined Publication No. 5-304235 discloses that solderability deteriorates due to an $NiO_2$ film on the surface of a nickel-plated lead frame, Japanese Patent Unexamined Publication No. 7-164136 discloses deterioration in solderability due to an oxide film during brazing of aluminum, and Japanese Patent Application No. 2527278 discloses that solderability deteriorates due to tin oxide on the surface of a material to be soldered. In these publications, as improving means, the bonded surfaces of base materials, i.e., materials to be bonded, are modified.

However, surface treatment of the base materials is performed for a lead frame or the like which has already been incorporated into a circuit board, and thus circuits and a package thereof must be subjected to modification treatment. There is thus the drawback that in treatment under the condition of high temperature, for example, in plasma processing or the like, various equipment loads such as a measure for preventing damage to a circuit element, etc. are significantly increased.

In addition, although a flux is used for removing an oxide film from a base material, even when a non-corrosion type flux is used for bonding a lead of an electronic apparatus, a problem occurs in which peripheral device materials area are contaminated by coating the flux.

Further, since a flux must be coated before the soldering step, the process is limited.

Although, in some examples, a hydrogen-containing flux is used for soldering, it is necessary to wash out the residual flux after soldering. In some cases, the residual flux is not washed out after soldering. However, in such cases, a flux containing a small amount of halogen is used to sacrifice the solderability, or a flux containing a large amount of halogen is used for maintaining solderability, thereby causing the probability of generating migration due to the halogen component in the residual flux.

OBJECT OF THE INVENTION

It is an object of the present invention to overcome the aforementioned problems.

Another object of the present invention is to provide a brazing or soldering material in which the solderability thereof can effectively be improved without using a flux, and a production method thereof.

SUMMARY OF THE INVENTION

In order to achieve the objects of the present invention, rather than modifying of the surfaces of base materials, the function to improve solderability for base materials may be imparted to a brazing or solder material as a bonding main material.

Namely, a brazing or soldering material of the present invention is formed by dispersing 10 ppm to 10% of halogen compound, by weight, in a raw material comprising a brazing or soldering material for bonding base materials. The surface of a brazing or soldering material for bonding base materials may be coated with a halogen compound or halogenated to form a halogen compound-substituted layer as a surface layer. In such cases, the halogen compound is preferably a fluorine or chlorine compound.

Another method of producing a brazing or soldering material of the present invention comprises dissolving a halogen compound and coating the resultant solution on the surface of a brazing or soldering material body as a semi-processed product for bonding base materials, and then naturally drying to form a film of the halogen compound, or placing a brazing or soldering material body as a semi-processed product for bonding base materials in a sputtering or vaporization apparatus, and then forming a sputtered or deposited film of a halogen compound on the surface of the brazing or soldering material body while introducing a halogen-containing gas into the apparatus.

Further, a brazing or soldering material of the present invention may be produced by immersing a brazing or soldering material body as a semi-processed product for bonding base materials in a halogen-containing solution, and naturally drying to halogenate the surface layer of the brazing or soldering material body, or placing a brazing or soldering material body as a semi-processed product for bonding base materials in a closed vessel containing heating means, and halogenating the surface layer of the brazing or soldering material body by the heating means under a temperature condition ranging from the gas decomposition temperature to the melting temperature of the brazing or soldering material while introducing a halogen-containing gas into the vessel.

In the above production methods, the halogen is preferably fluorine or chlorine.

The brazing or soldering material to which a halogen compound is added and dispersed is produced, the surface of the thread- or rod-shaped brazing or soldering material is coated with a halogen compound, or the surface layer of the brazing or soldering material is directly halogenated. In brazing or soldering using the brazing or soldering material under heating, oxygen of the oxide films formed on the surfaces of members to be bonded is replaced by halogen. For example, tin oxide (SnO) formed on the surface layer of a lead frame plated with solder is replaced by a halogen compound (SnFx). This improves solderability of the brazing or soldering material. Such a halogen compound prevents re-oxidation of the brazing or soldering material itself, and thus permits long-term storage of the brazing or soldering material.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is a drawing illustrating solder production means;

FIG. 2 is a schematic drawing of the construction of a sputtering apparatus; and FIG. 3 is a schematic drawing of the construction of a fluorination apparatus.

DESCRIPTION OF THE PREFERRED EMBODIMENTS

A preferred embodiment of the present invention will be described below.

In an embodiment, as a method of producing a joining, brazing or soldering material, there are possible methods including a method in which a halogen compound is mixed with and dispersed in a raw solder material and then molded, a method in which a film of a halogen compound is formed on the surface of a molding of a soldering material, and a method in which the surface layer of a molding of a soldering material is modified to a halogen compound layer.

The method in which a halogen compound is mixed with and dispersed in a raw solder material and then molded may comprise as follows. Although the soldering material is generally contains tin, lead, silver or antimony as main components, a halogen compound is added to the raw material of the brazing or soldering material for bonding base materials. In this case, the halogen compound is added to and dispersed in a melt of the raw material of the soldering material, and then molded or formed in a cream with an appropriate binder.

An example of such production of solder is shown in FIG. 1. As shown in FIG. 1, a heating furnace 12 is heated to 350° C. or higher by a heater 10. To the furnace are added tin (about 60%) and lead (about 40%) as a raw material of a soldering material 14 and a halogen compound 16 such as tin fluoride (stannous fluoride: $SnF_2$ (melting point 210° C.)). The amount of the fluoride added is 0.5% by weight relative to the total amount of tin and lead.

Since the melting point varies with the mixing ratio of tin and lead, the temperature of the heater 10 can be arbitrarily changed. Also the atmosphere in the furnace is a nitrogen atmosphere because oxidation takes place in regular air. This method can be performed in vacuum, but requires care to prevent vaporization.

In such production of the soldering material, since fluorine is evaporated by heating for a long time, it is necessary to rapidly mix and cool the material. As the halogen compound as an additive, powders of lead fluoride, tin fluoride, and the like, liquids of hydrofluoric acid, hydrochloric acid and the like can be used. The amount of the halogen compound added depends upon application, the type of the soldering material, the material of an object to be bonded, but the amount is preferably several tens ppm to about 10%. With an amount of 10 ppm or less, the amount of halogen on the surface which actually contributes is very low because the halogen compound is dispersed in the soldering material itself, and the ability to improve solderability cannot be obtained. With an amount of 10% or more, since a large amount of halogen is added, particularly when the halide is water soluble, the product is corroded under the condition of high humidity. This makes conductive the water produced on the product by condensation due to the influence of halogen ions dissolved in the water, and thus causes short circuit and migration. Also, the water has corrosiveness properties and thus might cause a defect in the product itself.

The atmosphere for production of the soldering material is not limited to a nitrogen atmosphere, and atmospheres of other inert gases such as argon, helium, and the like can be used.

After mixing by the above method, the resultant mixture is supplied to a molding apparatus after cooling or in a melt state to form solder threads, solder rods or solder balls. Such solder as fine solder balls may be mixed with a binder and then kneaded by agitation to form a solder cream.

If an active gas such as $ClF_3$ or the like which can be expected to be dissociated by heating is used as an atmosphere, the additive need not be mixed. Further, for example, the additive can be added during molding to solder balls.

Next, the method of forming a film of a halogen compound on the surface of a molding of the soldering material may comprise as follows. In this method, a film of a fluoride or chloride may be formed on the surface of the solder molding by plating or coating, or a halogen compound film may be formed by a dry method using a sputtering apparatus or the like. For example, in wet coating, a solution obtained by dissolving a halogen compound such as stannous fluoride or the like in pure water is coated directly on the surface of the molded solder such as solder balls by using a brush, and then naturally dried without being wiped out. The coating step is repeated several times to form a film on the surface of the solder. It is thought to be preferable that the concentration of the halogen compound solution is 50 to 90% which has fluidity sufficient for coating and which permits easy drying in the subsequent step. Alternatively, the surface of the solder molding may be covered with a powder of stannous fluoride, and water droplets may be dropped on the surface, followed by natural drying.

Although, in the above method, the surfaces of the solder balls are treated, the surface of the solder printed on a circuit board or the like can be treated by the same method. Namely, the surface of the solder which has previously been adhered to a junction of the circuit board by coating or printing a solder cream or plating solder is fluorinated to permit fluxless soldering of a component onto the circuit board while preventing surface oxidation. Besides the above methods, the solderability can be expected to be improved by dispersing a powder of calcium fluoride in plating solder and then coating or printing the solder on a circuit component or the like.

Alternatively, a film may be formed on the surface of the solder molding by a dry method. This can be realized by forming a sputtered film of a halogen compound on the surface of the soldering material body. FIG. 2 shows an example of the configuration of a sputtering apparatus for forming a sputtered film. On a rotating table 22 provided in a vacuum chamber 20 are set solder balls 24. The purpose of the rotating table 22 is to rotate the solder balls 24 set thereon by rotation of the rotating table 22 to form a sputtered film over the whole surfaces of the solder balls. In the vacuum chamber 20 are provided through an insulator 26 a sputtering electrode 28 on the surface of which a target 30 is provided. The material of the target is tin (purity 99.9%). The target 30 may contain lead, as usual soldering materials, or another metal may be used as the target 30 without problems. However, the target 30 must be determined in consideration of the melting point during soldering, and corrosiveness and electrical conductivity during use. The inventors select tin as the target in order to realize the recent demand for a leadless target. The sputtering electrode 28 is provided with a high frequency power source 34 through an impedance matching circuit 32. Since the target 30 comprises a metal, a film can be formed by DC sputtering using a DC power supply. However, this technique is active sputtering using an active gas, and thus high frequency discharge having advantages of reproducibility, discharge stability, etc. is selected.

In the above-described general sputtering apparatus, the air is evacuated to predetermined pressure (usually 1/10 to 1/1000 of sputtering pressure) through an evacuation port 36. In this embodiment, evacuation is carried out up to 0.1 Pa. Then argon (Ar) and carbon tetrafluoride ($CF_4$) are flowed through a gas inlet 38 at a rate of 300 SCCM and 30 SCCM, respectively, to control the sputtering pressure to 1 Pa. Although, in this embodiment, $CF_4$ is used, any gas containing fluorine, such as $SF_6$ or the like, may be used. In this state, high frequency power is applied to the target 30 under rotation of the rotating table 22 to form a film. The applied high-frequency power is 50 W. The high-frequency power is turned off 2 minutes after, and the inside of the vacuum chamber 36 is returned to atmospheric pressure to obtain a sample.

The solder balls 24 used as a sample are generally used for BGA mounting, and, in this embodiment, the solder balls used are Spark Ball (trade name) produced by Senjyu Metal Industry Co., Ltd. which is spherical solder having an outer diameter of 0.74 mm and a composition comprising 62.0 to 64.0% of tin and the balance consisting of lead.

Although the above embodiment uses the sputtering apparatus, vapor deposition can be, of course, used as a method other than sputtering. Of course, thermal CVD can also be performed.

The method of modifying the surface layer of a molding of the soldering material to a halogen compound layer can be carried out in a wet or dry manner, as described below. A wet modifying method comprises immersing the molding of the soldering material in a halogen-containing solution such as hydrochloric acid or hydrofluoric acid to halogenate the surface layer by surface treatment. A dry modifying method comprises setting the soldering material itself or solder, which has previously bee printed on a substrate, in a halogen gas which can form an active state of halogen atoms to convert the solder surface layer to a halogen compound layer by surface treatment.

FIG. 3 shows an example of construction of the wet method. FIG. 3 shows a fluorination apparatus comprising a closed vessel 40 in which a table provided with a heater 42 is provided so that the soldering material (in this example, solder balls) to be treated are placed on the table. The inside of the vessel is evacuated, and $ClF_3$ gas (5%) and Ar are introduced into the vessel to return the inside to about 10000 Pa. The purpose of evacuation is to completely replace air. Also evacuation is carried out by using a vacuum pump (not shown) while slightly flowing $ClF_3$. The purpose of this is to prevent an increase in pressure in the vessel during heating, and prevent a decrease in the gas concentration in the vessel and inflow of oxygen. The solder balls 44 contained in the vessel are heated to about 100° C. by the heater. After treatment for 10 minutes, the inflow of $ClF_3$ gas is stopped, and the residual gas is replaced to obtain the surface-treated solder balls.

In each of the above embodiments, during production of the soldering material, a halogen compound is mixed with the soldering material, or a film is formed on the surface of the molded soldering material or the surface is halogenated to improve solderability of fluxless soldering, and improve bonding performance. This effect can be applied to bonding components of materials other than electrical materials, for example, a structure can possibly be produced by bonding metals with the soldering material. The solderability improving effect was found in brazing materials, for example, improvement in solderability was also be found in silver solder.

In addition, since a halogen compound is mixed with a soldering material, a film of a halogen compound is formed on solder or the surface of solder is coated with a halogen compound by one surface treatment, as described above, it is possible to prevent oxidation and obtain a large effect even if the soldering material is allowed to stand for a long time without being used for soldering. Even in actual experiments, it was confirmed that the effect is maintained for 1 month or more if the solder is not positively washed or passed through the heating step.

Therefore, in accordance with the present invention, when a soldering material is subjected to film deposition or surface treatment in an early stage, it is possible to prevent surface oxidation. This represents that the treatment step immediately before soldering is made unnecessary, as ordinary fluxes, and brings about significant improvement in productivity.

EXAMPLES

The examples performed for confirming the effect of the above-described construction will be described below.

Example 1

In this example, a soldering material was produced by adding a fluorine compound during mixing the soldering material.

First the heating furnace shown in FIG. 1 was heated to 350° C. or higher. Tin fluoride (stannous fluoride: $SnF_2$ (melting point 210° C.)) was added together with tin (about 60%) and lead (about 40%) as a raw material of the soldering material. The amount of the tin fluoride added was 0.5% by weight relative to the total of tin and lead.

After mixing, the resultant mixture was cooled to be formed in a predetermined shape, and then heated to 235° C. to form a melt state. Various metallic samples were dipped in the melt to evaluate whether or not the solder was adhered to the samples.

The samples used were metallic pieces of 5 mm wide×30 mm long×0.5 mm thick, and the materials therefor included aluminum, copper, palladium-plated copper, solder (tin 90%, lead 10%)-plated copper, and silver-plated copper. These samples were evaluated by a solder checker (SAT-5000) produced by Lesker Co., Ltd. This checker was used for measuring solderability by observing the surface tension of the solder and a sample after the sample was dipped in the solder melt. In this method, the force to pull a sample into the solder melt (an index indicating good solderability) or the force to conversely push up a sample from the solder melt (an index indicating poor solderability) was shown as numerical data. When solder had good solderability, a plus value indicating the force to pull a sample into the solder melt was measured. Conversely, when solder had poor solderability, a minus value indicating the force to push out a sample was measured.

In the above evaluation method, each of the samples was dipped to 4 mm in the solder bath, and maintained for 10 seconds to evaluate solderability. The results are shown in the table below.

TABLE 1

|  | Measurement of force | | Visually determined amount of solder adhered | |
|---|---|---|---|---|
|  | Untreated solder | Treated solder | Untreated solder | Treated solder |
| Aluminum | −4 mN- | 4 mN | 0 mm | 0 mm |
| Copper | −4 mN | −3.5 mN | 0 mm | 0 mm |
| Pd plated | −4 mN | 0 mN | 0 mm | 2 mm |
| Silver plated | −2 mN | +2 mN | 1 mm | 4 mm |
| Solder plated | −2 mN | +2 mN | 1 mm | 4 mm |

The above table indicates that solderability for each of the palladium-plated, silver-plated and solder-plated samples is improved. Particularly, the effects on the silver-plated and solder-plated surfaces are the same as a case using solder containing a flux.

Example 2

In this example, a soldering material containing tin and lead as main components was molded into the shape of solder balls or solder threads, and a fluoride film was formed by wet coating on the surface of the molded solder body or the solder printed on the surface of a material to be bonded. In this example, the solder balls were used, a fluoride solution was coated on the surfaces of the solder balls, and the solder balls were placed on a test piece (various metallic chips) to measure the flow (spread) of the solder in heating.

First 97% stannous fluoride was dissolved in pure water to form a 50% solution, and the resultant solution was coated on the surfaces of the solder balls by a brush, followed by natural drying without being wiped off. This process was repeated several times to obtain a sample. This can be realized by covering the solder balls with 97% stannous fluoride (powder), dropping water droplets on the solder balls, and then naturally drying the solder balls.

In this way, a film of tin fluoride ($SnO_yF_x$) was formed on the surfaces of the solder balls. The solder balls used as a sample are generally used for BGA mounting. The solder balls used in this example were Spark Ball (trade name) S produced by Senjyu Metal Industry Co., Ltd. which was spherical solder having an outer diameter of 0.74 mm and a composition comprising 62.0 to 64.0% of tin and the balance consisting of lead.

The thus-treated solder balls were heated on a metallic sample to measure a dispersion state. The metallic samples used included samples having a copper surface, tin-plated copper surface, a palladium-plated copper surface, a silver-plated copper surface, and a solder-plated copper surface.

The results are shown in the table below.

TABLE 2

|  | Untreated solder balls | Fluorinated solder balls |
|---|---|---|
| Copper | about 1.0 mm | about 1.0 mm |
| Tin-plated | about 1.5 mm | about 4.0 mm |
| Palladium-plated | about 1.0 mm | about 1.5 mm |
| Silver-plated | about 1.5 mm | about 4.0 mm |

TABLE 2-continued

|  | Untreated solder balls | Fluorinated solder balls |
|---|---|---|
| Solder-plated | about 2.1 mm | about 5.0 mm |
| Aluminum | about 1.0 mm | about 1.0 mm |

As seen from the results, solderability for copper and aluminum is not improved, while the tin-plated sample, silver-plated sample and solder-plate sample exhibit high effects. It is thought that the copper and aluminum samples are significantly affected by surface oxidation in the early stage or surface oxidation due to a temperature rise in the soldering work.

Example 3

In this example, a sputtered film of a fluoride was formed on the surface of a molded solder body obtained by molding a soldering material containing tin and lead as main components into solder balls or solder threads. In this example, the solder balls were used, and a sputtered film of tin fluoride was formed on the solder balls, and the solder balls were placed on a test piece (various metallic chips) to measure the flow (spread) of the solder in heating.

Experiment was carried out as follows. The sputtering apparatus shown in FIG. 2 was used, and the solder balls were set on the rotating table provided in the vacuum chamber. The material of the target was 99.9% purity tin. The inside of the sputtering apparatus was first evacuated through the evacuation port to a predetermined pressure (generally $1/10$ to $1/1000$ of sputtering pressure). In this example, evacuation was performed up to 0.1 Pa. Then, argon (Ar) and carbon tetrafluoride (CF4) were flowed through the gas inlet at rates of 300 SCCM and 30 SCCM, respectively, to control the sputtering pressure to 1 Pa. In this state, high frequency power was applied to the target under rotation of the rotating table to form a film. The high frequency power was 50 W. Two minutes after, the high frequency power was turned off, and the inside of the vacuum chamber was returned to atmospheric pressure to obtain a sample.

The solder balls used as a sample used in this example were solder balls generally used for BGA packaging, i.e., Spark Ball (trade name) S produced by Senjyu Metal Industry Co., Ltd. which was spherical solder having an outer diameter of 0.74 mm and a composition comprising 62.0 to 64.0% of tin and the balance consisting of lead.

Evaluation was made for the sample produced as Sample 1 under the above conditions, comparative solder balls (Sample 2) on which no film was formed, a sample (Sample 3) in which the surfaces of solder balls were cleaned by reverse sputtering to remove an oxide film, and a sample (Sample 4) obtained by adhering a generally used flux to solder balls and then drying the solder.

The evaluation method comprised placing each sample on various metallic materials, and heating under atmospheric pressure (in air) to measure the size of the spread sample. The results are shown in the table below.

TABLE 3

|  | Sample 1 | Sample 2 | Sample 3 | Sample 4 |
|---|---|---|---|---|
| Aluminum | about 1.0 mm | about 1.0 mm | about 1.0 mm | about 1.0 mm |

TABLE 3-continued

|  | Sample 1 | Sample 2 | Sample 3 | Sample 4 |
|---|---|---|---|---|
| Silver | about 5.0 mm | about 2.0 mm | about 3.3 mm | about 4.8 mm |
| Tin | about 5.0 mm | about 1.5 mm | about 2.0 mm | about 5.3 mm |
| Copper | about 1.0 mm | about 1.0 mm | about 1.0 mm | about 1.0 mm |

The above results reveal the following:

(1) The solderability for the sample (Sample 3) in which an oxide film was removed from the surface is more excellent than ordinary solder (Sample 2).

(2) The solder (Sample 1) on which a film of a fluoride was formed exhibits a great effect, and is equivalent to Sample 4 treated with a flux.

(3) Samples 2, 3 and 4 exhibit improved solderability for silver and tin.

From the results (1) and (2), it is found that the sample having an oxide film on the surface thereof has poor solderability due to the oxide film, and the sample without an oxide film shows some improvement in solderability. However, oxidation takes place during soldering, only a little improvement effect can be obtained. Therefore, in a soldering work under a reflow of nitrogen, the improvement effect is expected to appear. On the other hand, Samples 1 and 4 have surfaces coated with fluoride films, and thus oxidation due to heating in soldering can be prevented. This indicates significant improvement in solderability. Also the solder surface coated with a fluoride film has the advantage of enabling long-term storage in this state.

The result (3) shows that even when the solder side is treated, some materials to be bonded exhibit no change in solderability. The cause for this is possibly related to the degree of oxidation of the surface of a metal to be bonded, the behavior of fluorine, and a problem of bonding to the solder.

In any case, the results shown in Table 3 reveal that solderability is significantly improved by forming a fluoride film on the surface of solder. It can thus be understood that formation of a fluoride film on a soldering material is effective means for enabling bonding with solder without using a flux, and enabling long-term storage of a soldering material while preventing oxidation, as described above.

Example 4

The same solder balls as described above were surface-treated by dipping in hydrochloric acid (35%). This was carried out by pouring 200 cc of hydrochloric acid into a Teflon beaker and setting the solder balls at a position of 10 cm from the liquid surface. The types of the samples used were as follows.

TABLE 4

| Sample 1 | dipped for 10 seconds |
| Sample 2 | dipped for 10 minutes |
| Sample 3 | dipped for 60 seconds and then naturally dried. |
| Sample 4 | dipped for 60 seconds and then washed with flowing pure water for 3 minutes. |

The degrees of solderability of the solder ball samples surface-treated by dipping were examined for each of samples including copper, aluminum, silver-plated copper, solder-plated copper and palladium-plated copper. The results are shown in the table below.

TABLE 5

|  | Untreated | Sample 1 | Sample 2 | Sample 3 | Sample 4 |
|---|---|---|---|---|---|
| Copper | about 1.0 mm | about 1.0 mm | about 1.0 mm | about 1.0 mm | about 1.0 mm |
| Aluminum | about 1.0 mm | about 1.0 mm | about 1.0 mm | about 1.0 mm | about 1.0 mm |
| Ag-plated | about 2.5 mm | about 3.0 mm | about 3.5 mm | about 3.5 mm | about 1.0 mm |
| Solder-plated | about 2.0 mm | about 2.5 mm | about 3.0 mm | about 3.0 mm | about 1.0 mm |
| Pd-plated | about 1.0 mm | about 2.0 mm | about 2.5 mm | about 3.5 mm | about 2.0 mm |

The above table indicates that in this example, the palladium-plated product exhibits a significant effect. It is also found that the effect increases in the order of Sample 1, Sample 2 and Sample 3. This is possibly due to the influences of the treatment time and the concentration. The reason why the effect is decreased by washing is possibly that since a chloride is soluble, the chloride dissolves and disappears by washing, or chlorine is again replaced by oxygen.

Example 5

Samples of solder balls were surface-treated by dipping in hydrofluoric acid (35%) under different treatment conditions. 200 cc of hydrochloric acid was poured into a Teflon beaker, and each of the solder ball samples was set at a position of 10 cm from the liquid surface. The types of the samples used were the same as Table 4.

The degrees of solderability of the solder ball samples surface-treated by dipping were examined for each of samples including copper, aluminum, silver-plated copper, solder-plated copper and palladium-plated copper. The results are shown in the table below.

TABLE 6

|  | Untreated | Sample 1 | Sample 2 | Sample 3 | Sample 4 |
|---|---|---|---|---|---|
| Copper | about 1.0 mm | about 1.0 mm | about 1.0 mm | about 1.0 mm | about 1.0 mm |
| Aluminum | about 1.0 mm | about 1.0 mm | about 1.0 mm | about 1.0 mm | about 1.0 mm |
| Ag-plated | about 2.5 mm | about 3.5 mm | about 4.0 mm | about 4.5 mm | about 1.0 mm |
| Solder-plated | about 2.0 mm | about 3.5 mm | about 4.5 mm | about 4.5 mm | about 1.0 mm |
| Pd-plated | about 1.0 mm | about 1.0 mm | about 1.5 mm | about 2.0 mm | about 1.0 mm |

Table 6 indicates that the solder-plated sample and the silver-plated sample exhibit an effect. It is also found that the palladium-plated sample exhibits a slight effect which is lower than treatment with hydrochloric acid.

Example 6

In this example, the surface of a soldering material comprising tin and lead as main components, or solder printed on a substrate or the like was fluorinated by a dry method. In this method, fluorination was carried out by using a gas which contained at least fluorine and which could form an active state of fluorine atoms by thermal decomposition, such as $ClF_3$ or the like. Therefore, it is necessary that the treatment temperature is less than the melting temperature of the solder, and higher than the decomposition temperature of the gas used.

FIG. 3 shows a fluorination apparatus in which a table with a heater is provided in a closed vessel so that the solder balls to be treated are placed on the table. The inside of the vessel is evacuated, and ClF3 gas (5%) and Ar are introduced into the vessel to return about 10000 Pa. Evacuation is performed for completely replacing air. Also evacuation is carried out by a vacuum pump under a slight flow of $ClF_3$. The purpose of this is to prevent an increase in pressure in the vessel during heating, and prevent a decrease in the gas concentration in the vessel and the inflow of oxygen.

The solder balls contained in the vessel were heated to about 100° C. by the heater. After treatment for 10 minutes, the inflow of the ClF3 gas was stopped, the residual gas was replaced to obtain the sample. The solderability of the sample was compared with untreated solder balls.

The degrees of solderability of the solder ball samples surface-treated by dipping were examined for each of samples including copper, aluminum, silver-plated copper, solder-plated copper and palladium-plated copper. The results are shown in the table below.

TABLE 7

|  | Untreated solder balls | Fluorinated solder balls |
| --- | --- | --- |
| Copper | about 1.0 mm | about 1.0 mm |
| Tin-plated | about 2.0 mm | about 4.0 mm |
| Palladium-plated | about 1.0 mm | about 1.5 mm |
| Silver-plated | about 2.2 mm | about 4.0 mm |
| Solder-plated | about 2.3 mm | about 5.0 mm |
| Aluminum | about 1.0 mm | about 1.0 mm |

Like the other examples, solderability for the tin-plated sample, silver-plated sample, and solder-plated sample is improved. The reason why no effect is observed in copper and aluminum is that the surfaces of these metalss are oxidized.

As described above, in the present invention, a halogen compound is previously mixed with a raw solder material to form a brazing or soldering material, a film of a halogen compound is formed on the surface of a soldering material which has previously been molded, by a wet or dry method, or the surface of the solder molding is halogenated by a wet or dry method. The present invention thus has the effects of permitting fluxless bonding of a lead frame or the like, preventing oxidation of a junction in an actual bonding work to improve solderability, and permitting long-term storage of a soldering material while preventing surface oxidation.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A joining material for joining two base metals together by one of soldering and brazing, said joining material comprising:
    a raw joining material; and
    a halogen compound dispersed in said raw joining material, the halogen compound being 10 ppm to 10% weight of the raw joining material.

2. A joining material for joining two base metals together by one of joining and brazing, said joining material comprising:
    a raw joining material; and
    a halogen compound coating a surface of said raw joining material, the halogen compound being 10 ppm to 10% weight of the raw joining material.

3. A joining material for joining two base metals together by one of soldering and brazing, said joining material comprising a raw joining material, wherein a surface layer of said raw joining material is halogenated to convert the surface layer thereof to a halogen compound-substituted layer, and wherein the halogen compound is 10 ppm to 10% weight of the raw joining material.

4. A joining material according to claim 1, wherein the halogen compound is selected from a group consisting of a fluorine and chlorine compound.

5. A joining material according to claim 2, wherein the halogen compound is selected from a group consisting of a fluorine and chlorine compound.

6. A method of producing a joining material for joining two base metals together by one of soldering and brazing from a raw joining material comprising the steps of:
    dissolving a halogen compound in a solution;
    coating the resultant solution on a surface of the raw joining material as a semi-processed product; and
    naturally drying the surface to form a film of the halogen compound, wherein the halogen compound is 10 ppm to 10% weight of the raw joining material.

7. A method of producing a joining material for joining two base metals together by one of soldering and brazing from a raw joining material comprising the steps of:
    placing the raw joining material as a semi-processed product in one of a sputtering and deposition apparatus; and
    forming one of a sputtered film and a deposited film of a halogen compound on a surface of the raw joining material while introducing a halogen-containing gas into one of the sputtering and deposition apparatus, wherein the halogen compound is 10 ppm to 10% weight of the raw joining material.

8. A method of producing a joining material for joining two base metals together by one of soldering and brazing from a raw joining material comprising the steps of:
    dipping the raw joining material as a semi-processed product in a halogen-containing solution; and
    drying the raw joining material to halogenate a surface layer of the raw joining material, wherein the halogen compound is 10 ppm to 10% weight of the raw joining material.

9. A method of producing a joining material for joining two base metals together by one of soldering and brazing from a raw joining material comprising the steps of:
    placing the raw joining material as a semi-processed product in a closed vessel containing a heater;
    halogenating a surface layer of the raw joining material by the heater under a temperature condition ranging from a gas decomposition temperature to a melting temperature of the raw joining material while introducing a halogen-containing gas into the vessel; and
    forming a film of halogen compound on the surface layer of the raw joining material, wherein the halogen compound is 10 ppm to 10% weight of the raw joining material.

10. A method of producing a joining material according to claim 6, wherein the halogen is selected from the group consisting of fluorine and chlorine.

11. A method of producing a joining material according to claim 7, wherein the halogen is selected from the group consisting of fluorine and chlorine.

12. A method of producing a joining material according to claim 8, wherein the halogen-containing solution is a solution selected from the group consisting of a fluorine solution and a chlorine solution.

13. A method of producing a joining material according to claim 9, wherein the halogen is selected from the group consisting of fluorine and chlorine.

14. A joining material according to claim 1, wherein the raw joining material is selected from the group consisting of lead, tin, silver and antimony.

15. A joining material according to claim 2, wherein the raw joining material is selected from the group consisting of lead, tin, silver and antimony.

16. A joining material according to claim 3, wherein the raw joining material is selected from the group consisting of lead, tin, silver and antimony.

17. A method of producing a joining material according to claim 6, wherein the raw joining material is selected from the group consisting of lead, tin, silver and antimony.

18. A method of producing a joining material according to claim 7, wherein the raw joining material is selected from the group consisting of lead, tin, silver and antimony.

19. A method of producing a joining material according to claim 8, wherein the raw joining material is selected from the group consisting of lead, tin, silver and antimony.

20. A method of producing a joining material according to claim 9, wherein the raw joining material is selected from the group consisting of lead, tin, silver and antimony.

* * * * *